United States Patent
Li et al.

(10) Patent No.: US 6,645,802 B1
(45) Date of Patent: Nov. 11, 2003

(54) METHOD OF FORMING A ZENER DIODE

(75) Inventors: Sheau-Suey Li, Cupertino, CA (US); Shahin Toutounchi, Pleasanton, CA (US); Michael J. Hart, Palo Alto, CA (US); Xin X. Wu, Fremont, CA (US); Daniel Gitlin, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 122 days.

(21) Appl. No.: 09/877,690

(22) Filed: Jun. 8, 2001

Related U.S. Application Data

(62) Division of application No. 09/248,547, filed on Feb. 11, 1999, now Pat. No. 6,268,639.

(51) Int. Cl.[7] .......................................... H01L 21/8234
(52) U.S. Cl. .......................... 438/237; 438/983; 438/328
(58) Field of Search ................................ 438/200, 135, 438/335, 238, 275, 312, 237, 983, 328; 361/111, 56

(56) References Cited

U.S. PATENT DOCUMENTS

| | | | |
|---|---|---|---|
| 5,012,317 A | | 4/1991 | Rountre |
| 5,426,328 A | | 6/1995 | Yilmaz et al. |
| 5,477,414 A | | 12/1995 | Li et al. |
| 5,493,142 A | | 2/1996 | Randazzo et al. |
| 5,615,074 A | | 3/1997 | Avery |
| 5,663,860 A | | 9/1997 | Swonger |
| 5,674,761 A | * | 10/1997 | Chang et al. ............... 438/237 |
| 5,707,886 A | | 1/1998 | Consiglio et al. |
| 5,747,834 A | | 5/1998 | Chen et al. |
| 5,966,599 A | * | 10/1999 | Walker et al. ............... 438/228 |
| 5,982,600 A | * | 11/1999 | Cheng |
| 6,171,891 B1 | * | 1/2001 | Lee et al. ................... 438/197 |
| 6,400,542 B1 | * | 6/2002 | Lee et al. ................... 361/56 |

OTHER PUBLICATIONS

U.S. patent application Ser. No. 09/150,503, Toutounchi et al., filed Sep. 9, 1998.

Ajith Amerasekera and Charvaka Duvvury; "ESD in Silicon Integrated Circuits" published by John Wiley & Sons, Copyright 1955, pp. 30–52.

Umesh Shama et al.; "An ESD Protection Scheme for Deep Sub–Micron ULSI Circuits" 1995 Symposium on VLSI Technology Digest of Technical Papers; p. 85.

* cited by examiner

*Primary Examiner*—Jey Tsai
(74) *Attorney, Agent, or Firm*—Arthur J. Behiel; W. Eric Webostand; Edel M. Young

(57) ABSTRACT

An ESD protection circuit includes a bipolar transistor, a resistor, and a zener diode formed on and within a semiconductor substrate. The resistor extends between the base and emitter regions of the transistor so that voltage developed across the resistor can turn on the transistor. The zener diode is formed in series with the resistor and extends between the base and collector regions of the transistor. Thus configured, breakdown current through the zener diode, typically in response to an ESD event, turns on the transistor to provide a nondestructive discharge path for the ESD. The zener diode includes anode and cathode diffusions. The cathode diffusion extends down into the semiconductor substrate in a direction perpendicular to the substrate. The anode diffusion extends down through the cathode diffusion into the semiconductor substrate. The anode diffusion extends down further than the cathode diffusion so that the zener diode is arranged vertically with respect to the substrate. The cathode diffusion can be formed using two separate diffusions, one of which extends deeper into the substrate than other.

6 Claims, 3 Drawing Sheets

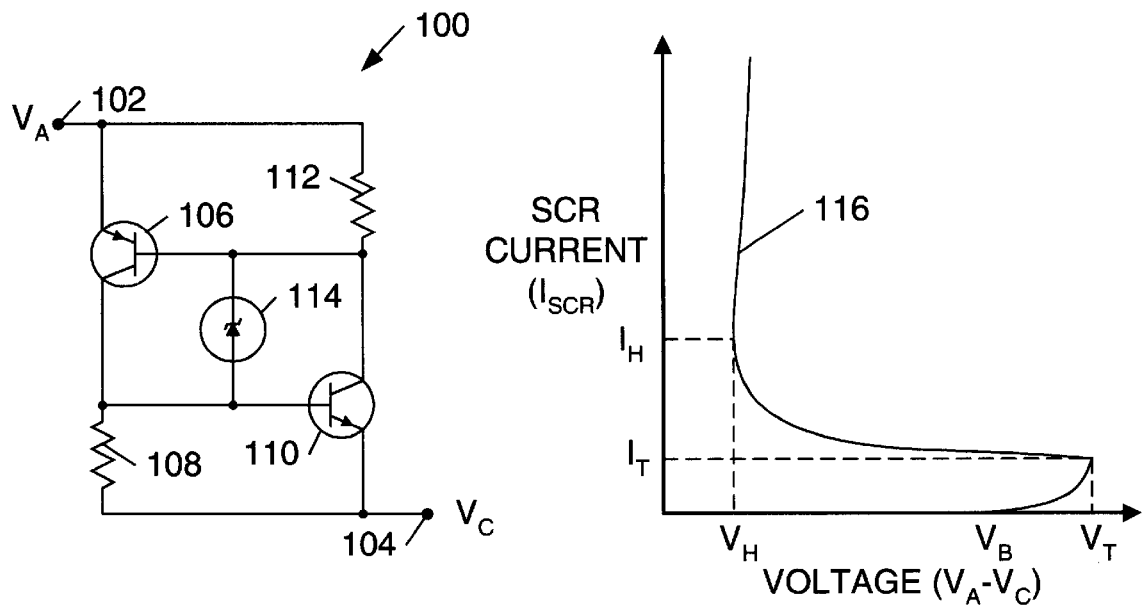
FIGURE 1A (PRIOR ART)
FIGURE 1B (PRIOR ART)
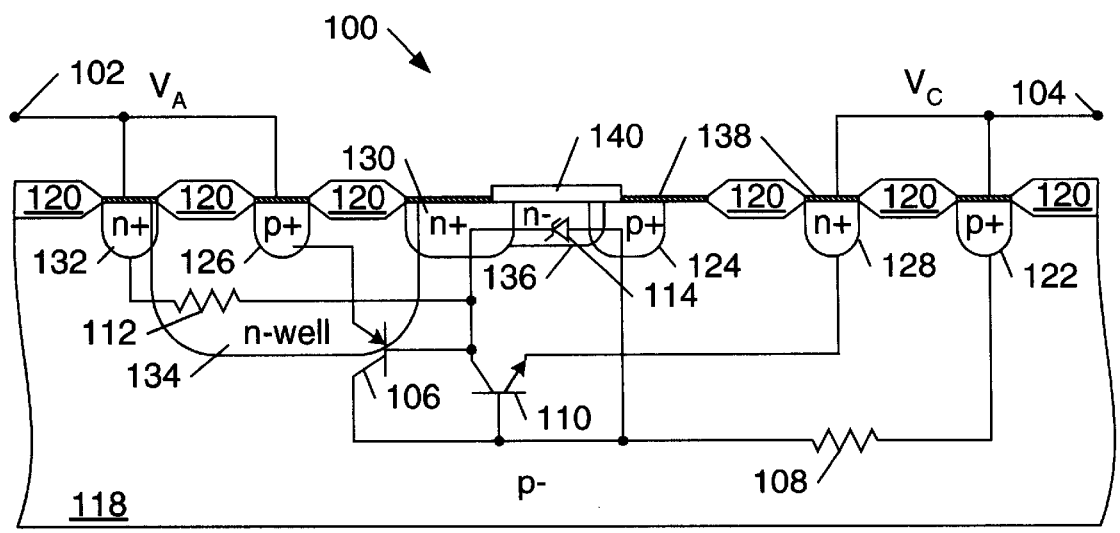
FIGURE 1C (PRIOR ART)

US 6,645,802 B1

METHOD OF FORMING A ZENER DIODE

FIELD OF THE INVENTION

This invention relates generally to over-voltage protection circuits, and in particular to electrostatic-discharge protection circuits.

BACKGROUND

An electrostatic discharge, or ESD, is a transient discharge of static charge. A familiar example of an ESD is the spark that can occur between a person and a grounded object after the person walks across a carpet. The person acquires a static charge from the carpet; contact with the grounded object allows the static charge to discharge.

The energy associated with an ESD event can easily damage sensitive integrated circuit (IC) components. Protection circuits that can handle the high energies of ESD events are therefore integrated with sensitive IC components so that the protection circuitry can dissipate ESD energy. Typically, a voltage clamp limits the voltage on a selected external IC pin to a level that will not damage ESD-sensitive components. For a discussion of voltage clamps for ESD protection, see Ajith Amerasekera and Charvaka Duvvury, *ESD in Silicon Intearated Circuits*, pp. 30–52 (1995), and U.S. patent application Ser. No. 09/150,503, entitled "Electrostatic Discharge Protection Circuit," by Shahin Toutounchi and Sheau-Suey Li, filed Sep. 9, 1998. Both of these documents are incorporated herein by reference.

FIG. 1A is a schematic diagram of a conventional silicon-controlled rectifier (SCR) 100. SCRs are used extensively to protect ESD-sensitive components. SCR 100 is a two-terminal voltage clamp having an anode 102 and a cathode 104. SCR 100 responds to ESD events on anode 102 by sinking current to cathode 104, primarily via a pair of current paths: a PNP transistor 106 and a resistor 108 define the first current path; an NPN transistor 110 and a resistor 112 define the second. SCR 100 also includes a zener diode 114 connected between the bases of transistors 106 and 110. Zener diode 114 exhibits a reverse-bias breakdown voltage that is low relative to standard diodes. As described below, zener diode 114 acts as a trigger element to help turn on transistors 106 and 110 in response to ESD events on anode 102.

Anode 102 remains in some active voltage range relative to cathode 104 during normal circuit operation. In a typical logic circuit, for example, cathode 104 might be grounded (i.e., held at zero volts) and anode 102 might transition between zero and five volts or zero and 2.5 volts. Such differences in potential between anode 102 and cathode 104 are insufficient to turn on zener diode 114, so very little current passes through resistors 108 and 112. As a result, the voltages dropped across resistors 108 and 112 are normally insufficient to turn on respective transistors 110 and 106.

An ESD on anode 102 can raise the voltage between anode 102 and cathode 104 well above normal operating levels. Significant increases will exceed the break-down voltage of zener diode 114, causing zener diode 114 to conduct. The resulting voltages developed across resistors 108 and 112 will then turn on respective transistors 110 and 106, thereby sinking ESD current from anode 102 to cathode 104.

FIG. 1B is a graph of an illustrative I–V curve 116 for SCR 100 (FIG. 1A): the x-axis represents the voltage difference between anode 102 and cathode 104 (i.e., $V_A - V_c$)

and the y-axis represents the current $I_{scr}$ through SCR 100 between anode 102 and cathode 104.

In the absence of an ESD (or some other over-voltage event), the anode voltage $V_A$ on anode 102 remains below the so-called "trigger" voltage $V_T$ required to turn on SCR 100. The current through SCR 100 therefore remains very low. When an ESD raises the anode voltage $V_A$ above trigger voltage $V_T$, the anode voltage $V_A$ will "snap back" to a holding voltage $V_H$. Once triggered, SCR 100 sinks current from anode 102 to cathode 104 until most of the energy of the ESD event is dissipated. The trigger voltage $V_T$ should be selected to ensure that SCR 100 triggers fast enough to avoid damaging any associated ESD-sensitive components (not shown).

Integrated circuits are becoming more complex as device engineers are able to pack more devices on each chip. These improvements are primarily due to advances in semiconductor processing technologies that afford the use of ever smaller circuit features. As features become smaller, reducing junction capacitance becomes increasingly critical to speed performance. One method of reducing junction capacitance involves the use of lower doping levels when forming substrates and well diffusions. Unfortunately, reducing doping levels complicates the task of providing adequate ESD protection.

ESD protection circuits typically include triggering mechanisms that depend upon the breakdown voltage of a selected junction. In general, the breakdown voltage of a given junction is inversely related to doping level. That is, lower doping levels provide higher breakdown voltages. The low well and substrate doping levels preferred for circuits with very small features can increase the breakdown voltage of ESD trigger mechanisms to unacceptably high levels. In modern 0.18-micron processes, the breakdown voltage of trigger mechanisms can approach the breakdown voltage of gate oxides. Consequently, an ESD-protection circuit can fail to trigger in response to an ESD event in time to avoid irreversibly damaging a neighboring gate oxide.

FIG. 1C is a cross-sectional diagram of an example of SCR 100 that addresses the problem of providing an adequate trigger mechanism for circuits with very small feature sizes. SCR 100 is formed on a p-type silicon substrate 118 using a conventional CMOS process. SCR 100 includes a number of diffusion regions, some of which are isolated from others by isolation regions 120. Isolation regions 120 are typically silicon dioxide formed using a conventional isoplanar isolation scheme. The diffusion regions include p+ regions 122, 124, and 126, n+ regions 128, 130, and 132, and an n– region 136. Of these, p+ diffusion 126 is formed within an n-well 134. A layer of silicide is divided into areas 138 that conventionally establish low-impedance electrical contact to the diffusion regions.

The various components of FIG. 1A are instantiated in substrate 118 as shown. For example, zener diode 114 is formed laterally between diffusion regions 124 and 130. A silicide block 140 prevents the zener junction formed between n– diffusion 136 and p+ diffusion 124 from shorting. Silicide block 140 is typically silicon dioxide. The break-down voltage of zener diode 114, and therefore the trigger voltage $V_T$ of SCR 100, depends primarily on the doping concentration of n– diffusion 136.

Instantiating zener diode 114 laterally, as depicted in FIG. 1C, allows process engineers a degree of flexibility in establishing the breakdown voltage of zener diode 114. The breakdown voltage of zener diode 114 can be adjusted by selecting an appropriate dopant dose for n– diffusion 136. Silicide block 140, typically silicon dioxide, then prevents zener diode 114 from shorting upon the formation of silicide layer 138. Unfortunately, the silicide blocking process is expensive and time consuming. Further, residual oxides from the formation of silicide block 140 can contaminate the subsequently formed silicide layers 138, and consequently increase their resistance. Finally, providing a sufficiently low breakdown voltage for zener diode 114 can be difficult for very dense ICs due to the use of reduced doping levels. There is therefore a need for an improved ESD protection circuit that works well in circuits with very small features and that does not require a silicide blocking process.

SUMMARY

The present invention is directed to a cost-effective ESD protection circuit that is easily integrated with circuits having very small features. One ESD protection circuit in accordance with the invention includes a bipolar transistor, a resistor, and a zener diode, all of which are formed on and within a semiconductor substrate. The transistor includes emitter, base, and collector regions. The resistor extends between the base and emitter regions such that voltage developed across the resistor can turn on the transistor. The zener diode is formed in series with the resistor and extends between the base and collector regions of the transistor. Thus connected, breakdown current through the zener diode, typically a response to an ESD event, turns on the transistor to provide a nondestructive discharge path for the ESD.

The zener diode includes anode and cathode diffusions. The cathode diffusion extends down into the semiconductor substrate in a direction perpendicular to the substrate. In accordance with one embodiment of the invention, the anode diffusion extends down through the cathode diffusion into the semiconductor substrate. The anode diffusion extends down further than the cathode diffusion so that the zener diode is arranged vertically with respect to the substrate.

In one embodiment, the cathode diffusion is formed using two separate diffusions, one of which extends deeper into the substrate than the other. This embodiment can be formed by implanting, in the following order, the deep cathode diffusion region, an anode diffusion region deeper than the deep cathode diffusion region, and the shallow cathode diffusion region. The dopant concentrations of the anode and deep cathode diffusions are selected to produce a zener diode having a sharp junction and a desired breakdown voltage. The zener diode can be incorporated into a CMOS IC without substantially modifying standard CMOS processes. Further, the zener diode provides appropriate breakdown voltages for ESD protection circuits integrated in densely populated ICs that employ relatively low well and substrate dopant levels.

BRIEF DESCRIPTION OF THE FIGURES

FIG. 1A is a schematic diagram of a conventional silicon-controlled rectifier (SCR) 100.

FIG. 1B is an illustrative I–V curve 116 for SCR 100: the x-axis represents the voltage $V_A$ on anode 102 and the y-axis represents the current between anode 102 and cathode 104.

FIG. 1C is a cross-sectional diagram of SCR 100 formed on a p-type silicon substrate 118 using a conventional CMOS process.

DETAILED DESCRIPTION

Figure 2:
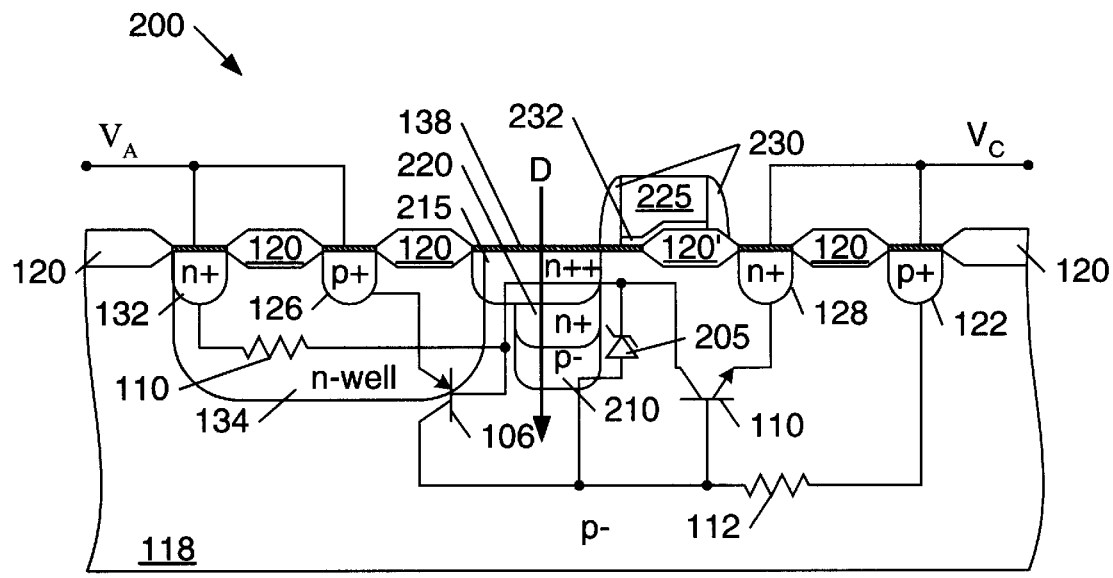
FIG. 2 is a cross-sectional diagram of an ESD protection circuit 200 in accordance with the invention.

FIG. 2 is a cross-sectional diagram of an ESD protection circuit 200 in accordance with the invention. ESD protection circuit 200 is similar to SCR 100 of FIGS. 1A–1C, like-numbered elements being the same. Protection circuit 200 additionally includes a vertically oriented zener diode 205 in place of lateral zener diode 114. Zener diode 205 includes a p-type anode diffusion 210 extending beneath an n-type cathode diffusion. The cathode diffusion, in turn, includes an n++ diffusion region 215 and an n+ diffusion region 220.

Protection circuit 200 also includes a mask layer 225, typically of polycrystalline silicon, formed over all or part of isolation region 120', one of isolation regions 120. Sidewall spacers 230 define the lateral limits of mask layer 225, while an oxide layer 232 defines the lower limit of mask layer 225. Mask layer 225, sidewall spacers 230, and oxide layer 232 are fabricated during the same process sequence used to form CMOS gate structures (not shown) elsewhere on substrate 118. The depicted embodiment can be fabricated, for example, using a conventional salicide CMOS process.

One edge of mask layer 225 and the associated spacer 230 extend laterally beyond one edge of the underlying isolation region 120' over a portion of substrate 118. Mask layer 225 and spacer 230 mask substrate 118 during the implantation of diffusions 210, 215, and 220. Zener diode 205 is therefore separated from isolation region 120' beneath mask layer 225 and spacer 230.

The separation between zener diode 205 and isolation region 120' is important for several reasons. First, in the absence of such separation, diode 205 would include defects, or surface states, associated with the interface between diode 205 and isolation region 120. These defects can increase the reverse-bias leakage current through diode 205. Second, isolation regions 120 are poor thermal conductors, and consequently do not dissipate heat effectively. When diode 205 conducts in response to an ESD event, most of the current travels through the region of diode 205 adjacent spacer 230. This current heats the area surrounding diode 205, and this heat must be dissipated to avoid destructive overheating. Isolating diode 205 from isolation region 120' allows diode 205 to dissipate heat more efficiently. The separation is approximately 0.2 to 0.3 microns in one embodiment adapted for fabrication using a 0.18-micron process. Note that an additional mask layer and spacer can also be provided over the opposite side of zener diode 205.

Figure 3:
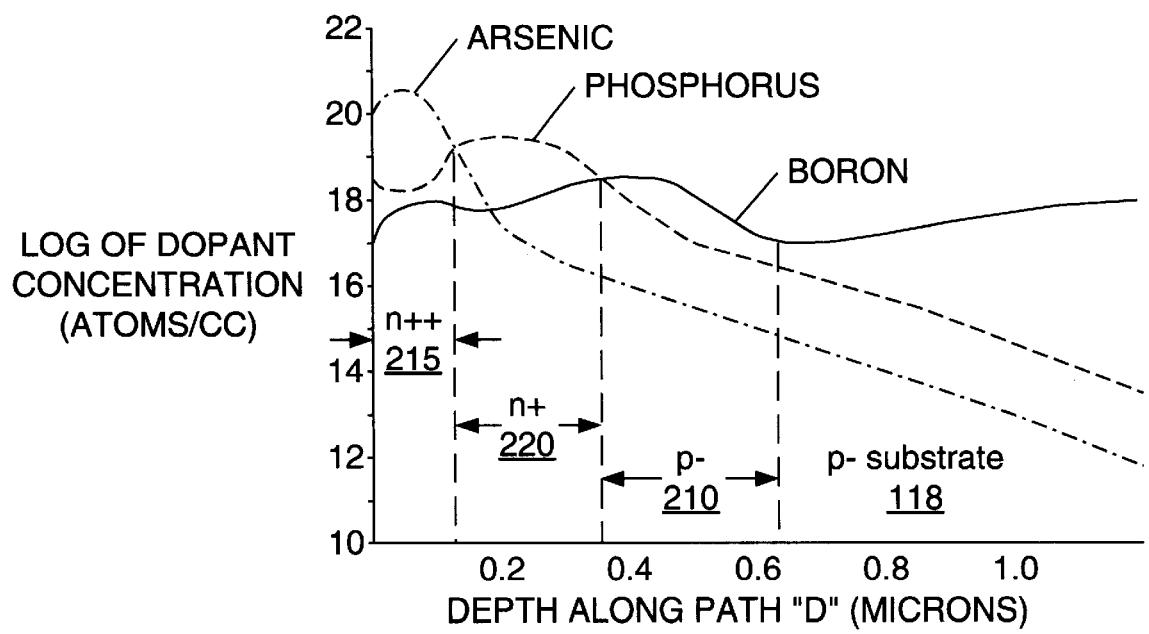
FIG. 3 graphically depicts typical doping levels for a zener diode in accordance with the present invention.

The breakdown voltage of zener diode 205 depends, in large part, on the dopant concentration of p– diffusion 210. This parameter can be adjusted by those of skill in the art to obtain a desired effect. For example, the dopant profile of FIG. 3 provides a zener breakdown voltage of approximately 5.5 to 7 volts, an appropriate range for 2.5-volt CMOS circuits formed using a 0.18-micron process.

The dopant concentration of n+ region 220 should be relatively high, above 1E15 atoms/cm$^2$, for example. Such dopant levels produce a sharp junction between n+ diffusion 220 and p− diffusion 210. Moreover, high dopant levels typically result in less post-anneal damage than medium dopant levels (on the order of 1E14 atoms/cm$^2$, for example), and consequently produce zener diodes with low leakage currents.

Diffusions 215, 220, and 210 can be formed in any order. In one embodiment, diffusion 220 is implanted before diffusion 210. Diffusion 215 is then implanted along with other similar source and drain diffusions that are formed during standard CMOS processes. An important aspect of SCR 200 of FIG. 2 is that all of the depicted features, other than diffusions 210 and 220, can be formed as part of a standard CMOS process.

Diffusions 210 and 220 are formed during a separate ESD mask step. As shown in FIG. 2, the cross-sectional areas of diffusions 210 and 220, as viewed from the direction of arrow "D," are less than that of diffusion region 215. Limiting the cross-sectional area of zener diode 205 limits the junction capacitance of zener diode 205, and consequently limits the capacitive load of protection circuit 200. In one embodiment, the length of p− diffusion 210 and n+ diffusion 220, as depicted in cross-section, is about one micron.

The depth of n++ diffusion 215 is limited by the application of simultaneously formed n++ diffusions used to instantiate CMOS transistors (not shown) that are to be protected by protection circuit 200. If too deep, the n++ diffusions used to form the CMOS transistors could punch through in response to ESD events, or even in response to other over-voltage events that occur during normal circuit operation.

In accordance with the invention, diffusion 215 is extended deeper into substrate 118 via diffusion 220. In the embodiment depicted in FIG. 3, for example, n+ diffusion 220 is more than twice as deep as diffusion 215. Extending diffusion 215 into substrate 118 moves the zener junction deeper into the substrate. Positioning the junction deep within substrate 118 is important because the junction dissipates a great deal of energy during an ESD event. Insulating delicate surface features, such as the silicide areas 138, from the junction therefore protects those features from excessive heating during ESD events. This feature renders embodiments of the invention compatible with silicide processes without requiring complex and expensive silicide blocking steps.

FIG. 3 graphically depicts doping levels along line "D" (FIG. 2) as a function of depth for one embodiment of the invention. Diffusion 215 is a standard n++ diffusion used in the manufacture of CMOS integrated circuits. Similar diffusions are used, for example, to form sources and drains for NMOS transistors formed in substrate 118 along with protection circuit 200. Diffusion 220 is a phosphorus diffusion having a peak phosphorus concentration of e.g. approximately 2E19 atoms/cm$^3$ at a depth of approximately 0.25 microns. Diffusion 220 is implanted, in one embodiment, at a dose of 5E14 atoms/cm using an implantation energy of 180 KeV. Diffusion 210 is a boron diffusion having a peak boron concentration of approximately 2E18 atoms/cm$^3$ at a depth of approximately 0.4 microns. Diffusion 210 is implanted, in one embodiment, at a dose of 7E13 atoms/cm$^2$ using an implantation energy of 120 KeV. The depicted dopant levels and diffusion depths are selected to provide a breakdown voltage of approximately five and one-half to seven volts, appropriate for a two and one-half volt CMOS circuit with 0.18 micron features. The dopant levels and diffusion depths can be adjusted as required for different types of circuits, as will be understood by those of skill in the art. As discussed above, for example, forming diffusion 220 with higher doses (e.g., above 1E15 atoms cm$^2$) can produce diodes with less leakage current than those produced with lower doses.

Figures 4A, 4B:
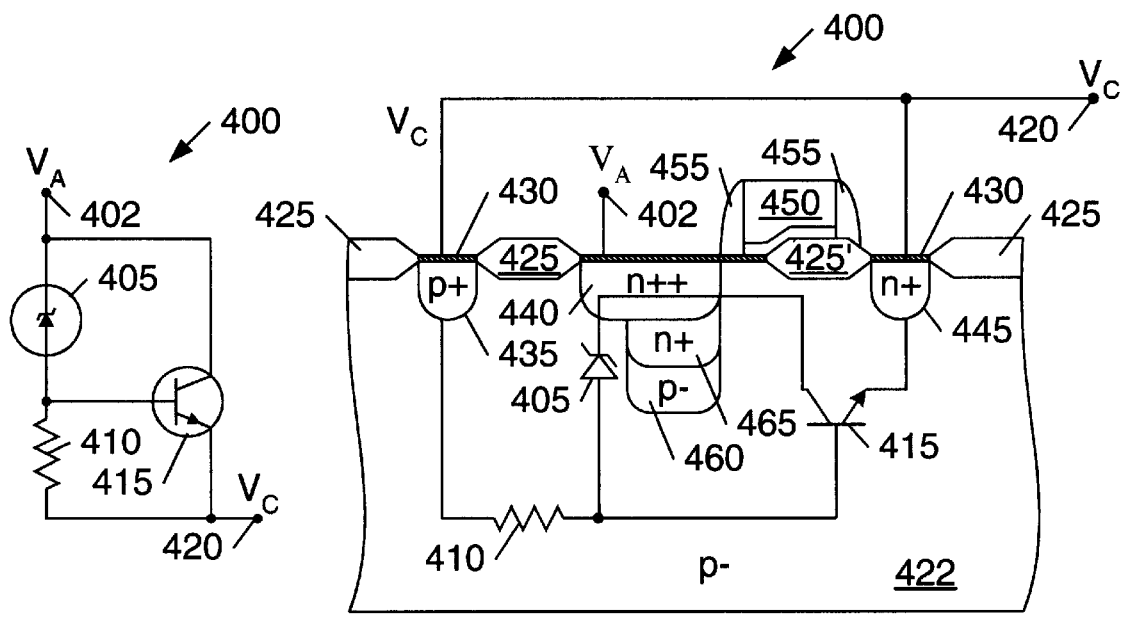
FIG. 4A schematically depicts an ESD protection circuit 400.
FIG. 4B is a cross-sectional diagram of protection circuit 400 formed in a semiconductor substrate 422.

FIG. 4A schematically depicts an ESD protection circuit 400. Protection circuit 400 is conventional at the schematic level depicted in FIG. 4A, and works in the following manner. Protection circuit 400 includes an anode 402, a vertical zener diode 405, a resistor 410, a bipolar transistor 415, and a cathode terminal 420. The voltage difference between anode 402 and cathode 420 remains in some active range during normal circuit operation. In a typical logic circuit, for example, cathode 420 is held at zero volts while anode 402 transitions between zero and five volts or zero and 2.5 volts. These voltage levels are not sufficient to turn on zener diode 405, so very little current passes through resistor 410. As a result, the voltage dropped across resistor 410 is insufficient to turn on transistor 415. An ESD event on anode 402 will cause diode 405 to conduct. The resulting voltage developed across resistor 410 will turn on transistor 415, thereby sinking current from anode 402 to cathode 420.

Protection circuit 400 has been modified in accordance with the invention. These modifications are apparent in FIG. 4B, a cross-sectional diagram of protection circuit 400 formed in a semiconductor substrate 422. In addition to the components of FIG. 4A, protection circuit 400 includes an insulation region 425, (typically silicon dioxide), a silicide layer 430 (typically titanium silicide), and p+ and n+ diffusion regions 435, 437, 440, and 445. Protection circuit 400 also includes sidewall spacers 455 and a mask layer 450 over all or part of one of isolation regions 425.

Zener diode 405 includes a p-type anode diffusion 460 extending beneath an n-type cathode diffusion. The cathode diffusion, in turn, includes n++ diffusion region 440 and an n+ diffusion region 465. As discussed above in connection with similar structures of FIG. 2, one edge of mask layer 450 and an associated spacer 455 extend laterally beyond isolation region 425' over a portion of substrate 422. Mask layer 450 and spacer 455 mask substrate 422 during the formation of diffusions 440, 465, and 460. Zener diode 405 is consequently separated from isolation region 425 beneath mask layer 450 and spacer 455. This separation is important for the reasons outlined above in connection with FIG. 2.

Deep n+ diffusion 437 serves two purposes. First, doping the region adjacent diode 405 improves heat conduction in the vicinity of diode 405. Second, the addition of diffusion 437 moves the junction between n++ diffusion 440 and substrate 422 away from the silicide overlaying diffusion 440. Moving the junction away from the silicide helps to prevent silicide spikes from penetrating the junction.

Figure 4C:
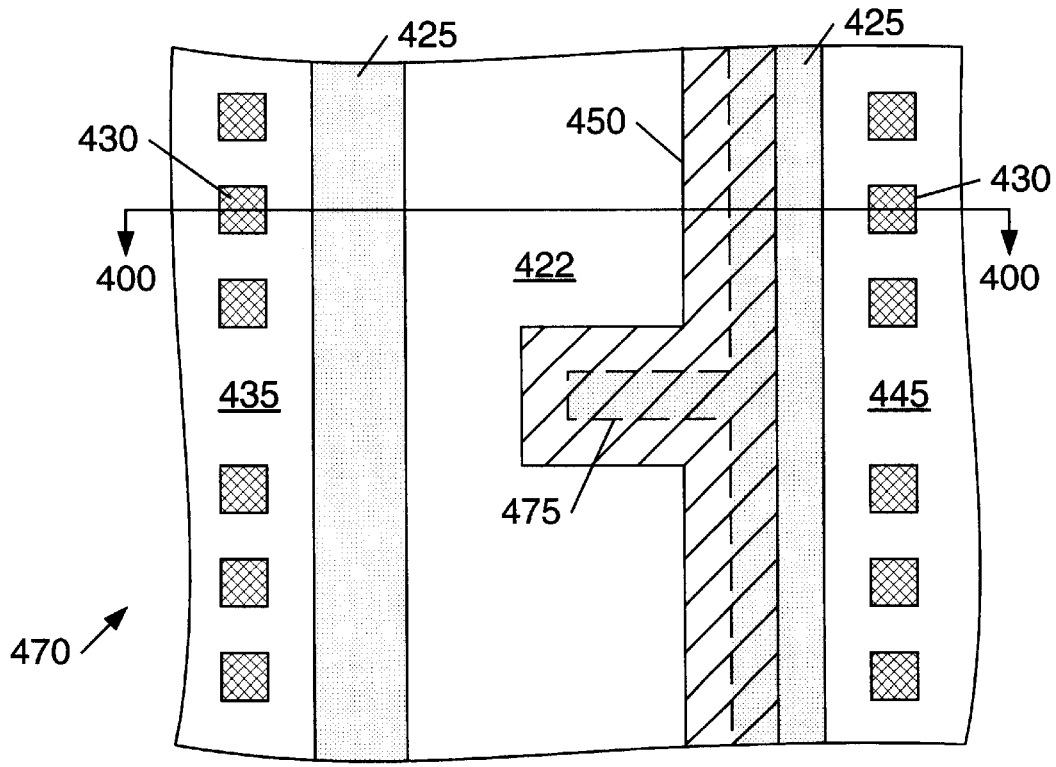
FIG. 4C shows an exemplary layout 470 for protection circuit 400 of FIGS. 4A and 4B.

FIG. 4C shows an exemplary layout 470 for protection circuit 400 of FIGS. 4A and 4B. Though FIGS. 4B and 4C are not identically scaled, the cross-section of FIG. 4B roughly corresponds to line 400—400 of FIG. 4C.

Mask layer 450—cross-hatched to distinguish it from isolation region 425 and substrate 422—is not electrically connected to external circuitry; in other words, mask layer 450 is "floating." (Oxide spacers 455 are omitted in FIG. 4C for simplicity.) A peninsula 475 of isolation region 425 extends laterally into substrate 422. Peninsula 475 separates n++ diffusion 440 into two distinct regions, each of which operates as an individual protection circuit. Peninsula 475 divides current among the two regions, preventing either one from "hogging" the current, which could potentially lead to destructive localized heating. This and other details of layout 470 are described in detail in U.S. Pat. No. 5,477,414, entitled "ESD Protection Circuit," by Sheau-Suey Li, Randy T. Ong, Samuel Broydo, and Khue Duong, issued Dec. 19, 1995, and incorporated herein by reference.

While the present invention has been described in connection with specific embodiments, variations of these embodiments will be obvious to those of ordinary skill in the art. For example:

1. the invention can be adapted for use with other types of avalanche-mode ESD protection devices;
2. the mask layers used to separate zener diodes from adjacent isolation regions can include materials other than polycrystalline silicon;
3. the invention is not limited to ESD protection devices, but may also be applied to advantage to provide protection from other types of over-voltage conditions; and
4. the invention may be readily adapted for use with ICs that employ trench or LOCOS isolation regions in leu of the isoplanar isolation regions depicted FIGS. 1C, 2, and 4B. Embodiments that employ deeper isolation regions should include deep n+ emitter diffusions. Referring to FIG. 2, for example, if isolation regions 120 are formed using a shallow trench isolation scheme, then n+ diffusion 128 should be extended using the same deep diffusion used to form n+ diffusion 220.

Therefore, the spirit and scope of the appended claims should not be limited to the foregoing description.

What is claimed is:

1. A method for forming a zener diode, comprising:

providing a semiconductor substrate, the semiconductor substrate having a first p-type concentration;

providing at least one field electrical isolation region;

providing a mask extending over at least a portion of the at least one field electrical isolation region and extending laterally away from the at least one field electrical isolation region;

forming a first conductive region in the semiconductor substrate partially aligned with the mask, the first conductive region having a second p-type concentration;

forming a second conductive region in the semiconductor substrate partially aligned with the mask, the second conductive region have a first n-type concentration, the second conductive region in contact with and above the first conductive region; and forming a third conductive region in the semiconductor substrate partially aligned with the mask, the third conductive region having a second n-type concentration, the second conductive region in contact with and above the third conductive region;

the first conductive region, the second conductive region and the third conductive region all having a common vertical alignment with one another in response to partial alignment with the mask and all spaced apart from the at least one field electrical isolation region in response to presence of the mask during formation of the first conductive region, the second conductive region and the third conductive region.

2. The method of claim 1 wherein the first conductive region, the second conductive region and the third conductive region are formed by implantation.

3. The method of claim 2 wherein the first p-type concentration and the second p-type concentration are p− concentrations.

4. The method of claim 3 wherein the first n-type concentration is an n+ concentration, and the second n-type concentration is an n++ concentration.

5. The method of claim 4 wherein the depth of the first conductive region is in a range of approximately 0.4 microns to 0.6 microns, the depth of the second conductive region is in a range of approximately 0.2 microns to 0.4 microns, and the depth of the third conductive region is in a range of approximately 0.0 microns to 0.2 microns.

6. The method of claim 5 wherein the first conductive region and the second conductive region in cross-section are approximately 1 micron wide.

* * * * *